United States Patent [19]
Razouk et al.

[11] Patent Number: 5,911,109
[45] Date of Patent: Jun. 8, 1999

[54] METHOD OF FORMING AN INTEGRATED CIRCUIT INCLUDING FILLING AND PLANARIZING A TRENCH HAVING AN OXYGEN BARRIER LAYER

[75] Inventors: Reda R. Razouk, Sunnyvale; Kulwant S. Egan; Wipawan Yindeepol, both of San Jose; Waclaw C. Koscielniak, Santa Clara, all of Calif.

[73] Assignee: National Semiconductor Corporation, Santa Clara, Calif.

[21] Appl. No.: 08/800,012

[22] Filed: Feb. 13, 1997

Related U.S. Application Data

[60] Continuation of application No. 08/310,612, Sep. 22, 1994, abandoned, which is a division of application No. 08/273,676, Jul. 12, 1994, abandoned.

[51] Int. Cl.$^6$ .................................................. H01L 21/62
[52] U.S. Cl. .............................................. 438/424; 438/430
[58] Field of Search ................................... 437/235, 231, 437/67; 257/513, 520; 438/424, 430

[56] References Cited

U.S. PATENT DOCUMENTS

| | | | |
|---|---|---|---|
| 4,455,325 | 6/1984 | Razouk | 427/85 |
| 4,635,090 | 1/1987 | Tamaki et al. | 357/50 |
| 4,656,497 | 4/1987 | Rogers et al. | 357/50 |
| 4,725,562 | 2/1988 | El-Kareh et al. | 437/67 |
| 4,907,063 | 3/1990 | Okada et al. | 357/54 |
| 4,952,524 | 8/1990 | Lee et al. | 437/67 |
| 5,011,788 | 4/1991 | Kawaji et al. | 437/67 |
| 5,059,550 | 10/1991 | Tateoka et al. | 437/67 |
| 5,099,304 | 3/1992 | Takemura et al. | 357/49 |
| 5,148,257 | 9/1992 | Kishi | 357/49 |
| 5,373,180 | 12/1994 | Hillenius | 257/520 |
| 5,384,280 | 1/1995 | Aoki et al. | 437/67 |

FOREIGN PATENT DOCUMENTS

| | | | |
|---|---|---|---|
| 0 060 785 A2 | 3/1982 | European Pat. Off. | 21/316 |
| 0 186 976 A3 | 12/1985 | European Pat. Off. | 21/316 |
| 0 435 550 A3 | 12/1990 | European Pat. Off. | 21/76 |
| 57-204144 | 12/1982 | Japan | H01L 21/76 |
| 60-249345 | 12/1985 | Japan | H01L 21/76 |
| 1217941 | 8/1989 | Japan | H01L 21/76 |
| 5-190658 | 7/1993 | Japan | H01L 21/76 |
| 5190658 | 7/1993 | Japan | H01L 21/76 |

OTHER PUBLICATIONS

Wolf, Stanley, "Silicon Processing For the VLSI Era", vol. 1, pp. 407–409 No Date.

Toshio Ogino et al, A New Planarization Technique for LSI Fabrication Utilizing Si–Ge Film Oxidation, Jan., 1985, Japanese Journal of Applied Physics, vol. 24, No. 1, pp. 95–101.

IBM Technical Disclosure Bulletin, Process for Simultaneously Forming Poly/EPI Silicon Filled Deep and Shallow Isolation Trenches Having a CVD Oxide Cap, Dec. 1990, vol. 33 No. 7, pp. 388–392.

C.G. Jambotkar, Improved Polysilicon–Filled Trench Isolation, IBM Technical DIsclosure Bulletin, Aug. 1984, vol. 27 No. 3, pp. 1481–1482.

*Primary Examiner*—Tuan H. Nguyen
*Assistant Examiner*—Matthew Whipple
*Attorney, Agent, or Firm*—Skjerven, Morrill, MacPherson, Franklin, & Friel L.L.P.; Kent B. Chambers

[57] ABSTRACT

A trench which has walls intersecting a surface of a semiconductor substrate and an oxidation/diffusion barrier layer lining the walls is disclosed. The oxidation/diffusion barrier extends over the edges of the trench to prevent, for example, stress defects in the trench corners and vertical bird's beak formation within the trench. A filler material such as polysilicon is deposited within the trench followed by the deposition of a planarizing layer over the trench. After heat is applied, the planarizing layer flows to form a planarized layer over the trench. Using high pressure and phosphosilicate glass for the planarizing layer, the planarizing layer flows appropriately at low temperatures for short times.

41 Claims, 5 Drawing Sheets

METHOD OF FORMING AN INTEGRATED CIRCUIT INCLUDING FILLING AND PLANARIZING A TRENCH HAVING AN OXYGEN BARRIER LAYER

This application is a continuation of application Ser. No. 08/310,612, filed Sep. 22, 1994 now abandoned, which is a division of application Ser. No. 08/273,676, filed Jul. 12, 1994, now abandoned.

BACKGROUND OF THE INVENTION

1. Field of the Invention

The present invention relates to the fabrication of integrated circuits having trenches, and particularly, to the filling of trenches, forming of a barrier layer, and planarizing a surface over the trenches.

2. Description of Related Art

The incorporation of multiple electrical devices on a single semiconductor wafer resulted in the advent of integrated circuit ("IC") technology. The fabrication of electrically isolated devices is critical in integrated circuit technology. The importance of effective isolation while allowing good surface planarity and occupying minimal space cannot be overemphasized.

In light of the need to isolate the electrical devices, various isolation technologies have been developed. An earlier method termed LOCOS (LOCal Oxidation of Silicon) was developed for p-channel metal oxide semiconductor (PMOS) and n-channel metal oxide semiconductor (NMOS) IC's to prevent the establishment of parasitic channels between adjacent devices thus providing inter-device isolation. LOCOS isolation involves the formation of a semirecessed oxide in the nonactive (or field) areas of the semiconductor substrate. Eventually, bipolar IC's employed a similar LOCOS isolation technology. However, well-known limitations are associated with LOCOS isolation such as the formation of bird's beak and non-planar surface topography. As device geometries reached submicron size, conventional LOCOS isolation technologies attained the limit of their effectiveness, and alternative isolation technologies were developed to increase the packing density of IC's. One such isolation technology developed involves a process of creating trench structures during IC fabrication. The utilization of trench structures to form electrical isolation areas accomplished several major goals including (1) isolation of transistors in bipolar circuits; (2) prevention of latchup and isolation of n-channel from p-channel devices in complimentary metal oxide semiconductor (CMOS); and (3) usage as storage-capacitor structures in Random Access Memories.

The trench lining, filling, and planarization processes are important factors in the fabrication of desirable trench structures. For example, Rogers et al., U.S. Pat. No. 4,656,497 describes a process of forming an isolation-trench in silicon, lining the trench walls, and filling the trench with silicon dioxide doped with impurities such as boron or phosphorus ("glass"). In order to avoid the presence of voids within the trench fill material and to form a planar surface, the glass is reflowed at atmospheric pressure and elevated temperatures of about 950° C. to 1,150° C. for about 30 minutes to four hours depending upon the glass thickness and the trench dimensions. Subsequently, the trench structure is again subjected to elevated temperatures of about 1,000° C. to 1,200° C. to outgas the phosphorus or boron impurities.

Another example, Lee et al., U.S. Pat. No. 4,952,524 describes a process of forming an isolation trench in a silicon wafer, lining the trench walls, and also filling the trench with an oxide filler material deposited on a thermal stress-relief layer of oxide. Subsequently, the trench fill material is flowed to remove voids and form a planar surface at atmospheric pressure at an elevated temperature preferably higher than the temperatures of all subsequent furnace heat treatments to which the wafer will be subjected.

However, the trenches have contacts between layers of silicon and silicon dioxide. Because of the differing thermal coefficients of expansion of silicon and silicon dioxide and the subjection of the trench structure to the elevated temperatures for relatively long periods of time, stress from the mismatch occurs. This stress tends to cause undesirable damage in silicon areas near the trench. Particularly, top edges of the trenches are susceptible to the generation of stress defects. Additionally, the wafers often contain relatively defined regions of dopant concentrations for active devices prior to the creation of a trench(es). As a result, subjecting the wafer to elevated temperatures for relatively long periods of time can result in the undesirable movement of the dopants outside of the defined regions. Dopant redistribution requires an increase in minimum device separation which in turn decreases device density.

Polysilicon filled trenches are an alternative to oxide filled trenches i.e. after the formation of the trench and lining the trench walls, the trench is filled with polysilicon. However, surface planarity is generally achieved by etching back the polysilicon, capping the structure using LOCOS techniques, and then etching back the LOCOS. Therefore, a very complex combination of multiple process steps is required to achieve surface planarity. Additionally, a diffusion/oxidation barrier such as silicon nitride is often used to line a trench prior to filling of the trench. The LOCOS technique tends to generate a vertical bird's beak in the area lying between the silicon wafer and the barrier layer. The vertical bird's beak will generate undesirable stress defects at the top edges of the trench.

SUMMARY OF THE INVENTION

The present invention overcomes the disadvantages of the related art by providing the advantages of a simple process with few process steps, a low thermal budget, excellent surface planarity, the elimination of stress defects especially at the trench corners, the minimization of dopant redistribution, and a vertical bird's beak free trench.

The present invention is an integrated circuit body with an orifice disposed in the body. The orifice has a wall intersecting a surface of the body to form a corner. A diffusion barrier is present and has a portion extending from the orifice onto the surface to overlap the corner. Fill material is disposed in the orifice. A layer of dielectric material is disposed over the surface of the body, over the orifice, and over the extending portion of the diffusion barrier.

In another embodiment, the present invention is a method of filling an orifice disposed in a semiconductor body which has an orifice opening onto a surface thereof. The method is accomplished by forming a diffusion barrier layer on part of the surface of the semiconductor body contiguous to the orifice opening so that a portion of the oxygen diffusion barrier layer extends from the orifice opening. A filler material is also deposited into the orifice and a dielectric layer is deposited over the filler material and over the portion of the diffusion barrier layer extending from the orifice opening.

BRIEF DESCRIPTION OF THE DRAWINGS

Reference numerals referring to the same features appearing in multiple figures are the same.

DETAILED DESCRIPTION OF THE PREFERRED EMBODIMENT

Figure 1:
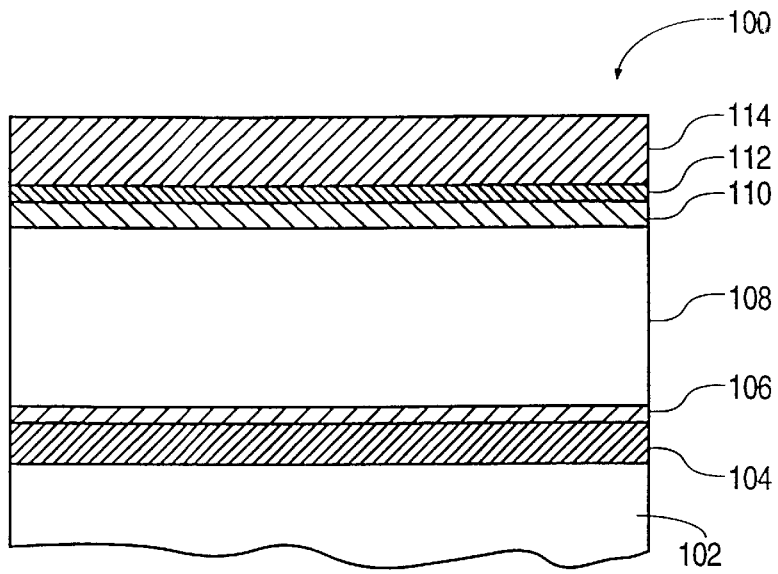
FIGS. 1 through 12 illustrate cross sectional representations of a portion of semiconductor wafer at successive steps in a process for fabricating the trench structure and a planarized surface.

Beginning with FIG. 1, a cross-sectional view of semiconductor wafer 100 in various stages of fabrication is depicted. Wafer 100 is formed by bonding a handle wafer (e.g. p substrate 102) with a device wafer (e.g. $n^+$ buried layer 106 and silicon device layer 108) using a suitable bonding process. Suitable bonding processes are well known to those of ordinary skill in the art, and include silicon bonding with other materials such as sapphire and quartz as discussed in Imthurn, Garica, Walker and Forbes "Bonded Silicon-on-sapphire Wafers and Devices", *Journal of Appl. Physics* 72(6), Sep. 15, 1992 and in Abe, Sunagawa, Uchiyama, Yoshizawa, and Nakazato "Fabrication and Bonding Strength of Bonded Silicon-Quartz Wafers", *Jpan. Journal of Appl. Physics* Vol. 32, 1993, pp. 334–337, respectively. A semiconductor wafer 100 incorporating a p- or n-type substrate 102, a 1 $\mu$m oxide bonding layer 104, an $n^+$ buried layer 106, and a silicon device layer 108 provide an appropriate starting platform for the trench formation. The combined dimensions of device layer 108 and $n^+$ buried layer 106 are 12 $\mu$m. Although the existence of specific layers, dopant types, and dimensions have been particularly described, other wafers and parameters will be acceptable. For example, the depth of device layer 108 may be as shallow or deep as that necessary to fabricate active devices. Other suitable wafers may incorporate more or less layers, varying doping materials and concentrations, and varying layer dimensions along with other attributes known to be useful in the fabrication of IC's.

Figure 2:
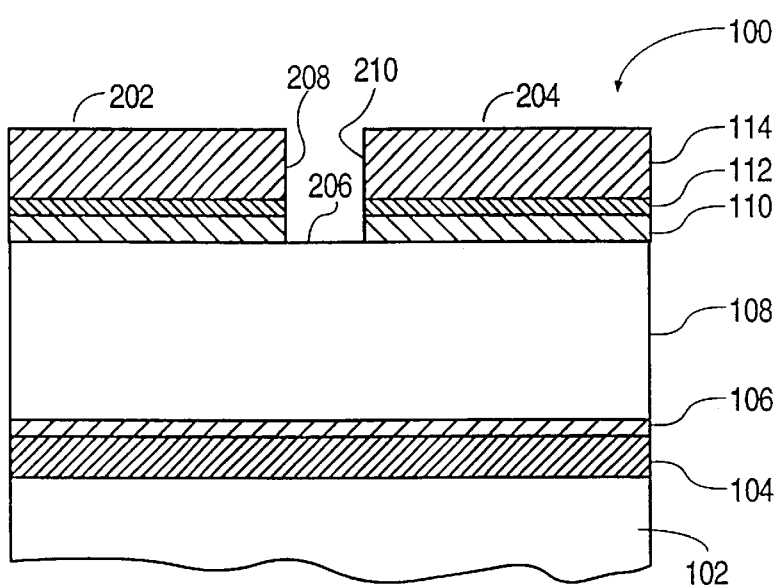

The trench forming process begins with the formation of a hard mask characterized by a 1000 Å thermal silicon dioxide layer 110 ("thermal oxide"), a 300 Å silicon nitride ($Si_3N_4$) ("Nitride") layer 112, and a 5000 Å low temperature silicon dioxide layer ("LTO") layer 114, the formations of which are well known to those skilled in the art. LTO layer 114 should be of a minimum sufficient thickness to protect the underlying layers during a subsequent etching of device layer 108 described below in conjunction with FIG. 3. Following the formation of the hard mask, a photoresist layer (not shown) is applied on top of LTO 114. The photoresist layer may be developed by conventional techniques so as to mask the areas defined by LTO surfaces 202 and 204 as shown in FIG. 2 i.e. the areas where the trench will not be located. The area between LTO surfaces 202 and 204 defines the location and width of the trench to be formed. Next, an anisotropic etch is used to etch through the hard mask forming an opening between LTO surfaces 202 and 204 and exposing surface 206 of device layer 108 as shown in FIG. 2. LTO surfaces 202 and 204 remain substantially unetched due to the masking effect of the photoresist. The photoresist layer (not shown) is subsequently removed by conventional techniques.

Figure 3:
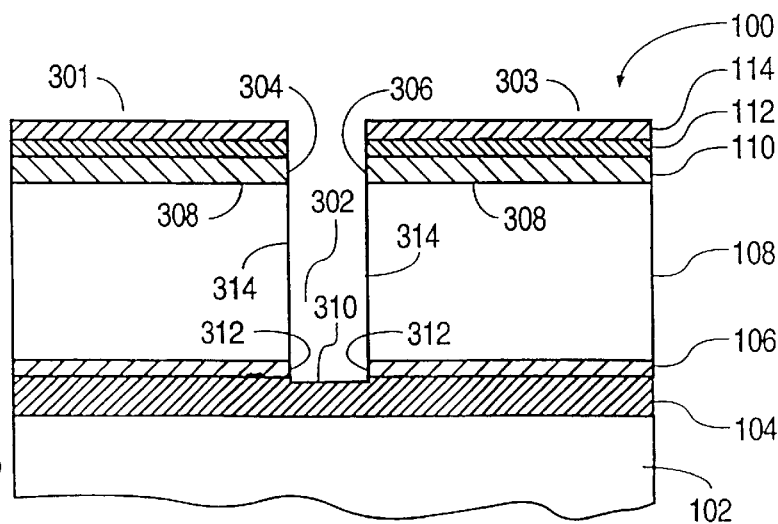

Wafer 100 is now ready for trench etching. Referring to FIG. 3, the device layer 108 and, $n^+$ buried layer 106, are anisotropically etched down to silicon dioxide layer 104 in order to provide effective electrical isolation between adjacent electrical device. regions 301 and 303. A conventional reactive ion etch process may be used. The previously formed hard mask effectively prevents etching of the device layer 108 beneath LTO surfaces 202 and 204. The trench etching process removes approximately 3000 Å of the original 5000 Å of LTO layer 114. The trench walls 314 and bottom 310 form corners 312 following the reactive ion etching process. The corners 312 are generally perpendicular when using a bonded wafer but may be rounded when other types of wafers are used. The anisotropic etching process results in the formation of trench 302 which, illustratively, has a depth of 12 $\mu$m measured from the surface 308 of device layer 108 to the bottom 310 of trench 302, a width of about 2.0 $\mu$m and an aspect ratio of about 6. Additionally, the minimum trench depth is set by the maximum depth of the active devices fabricated in device layer 108.

Figure 4:
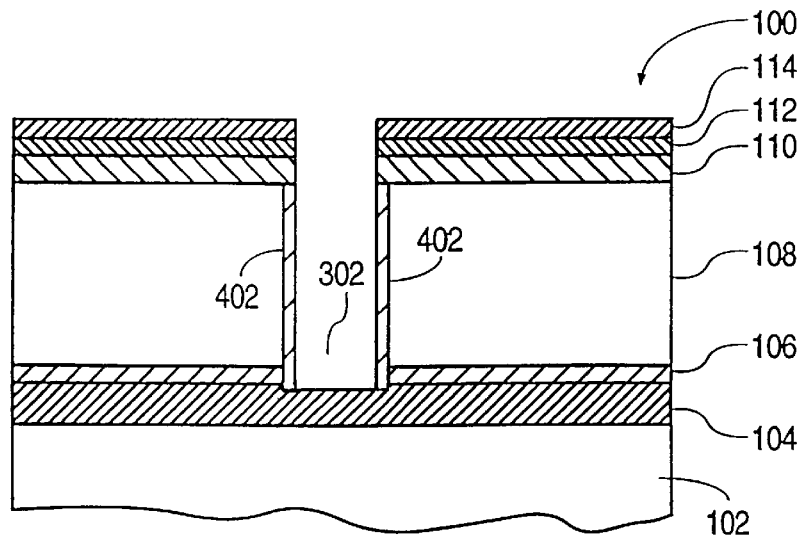
Figure 5:
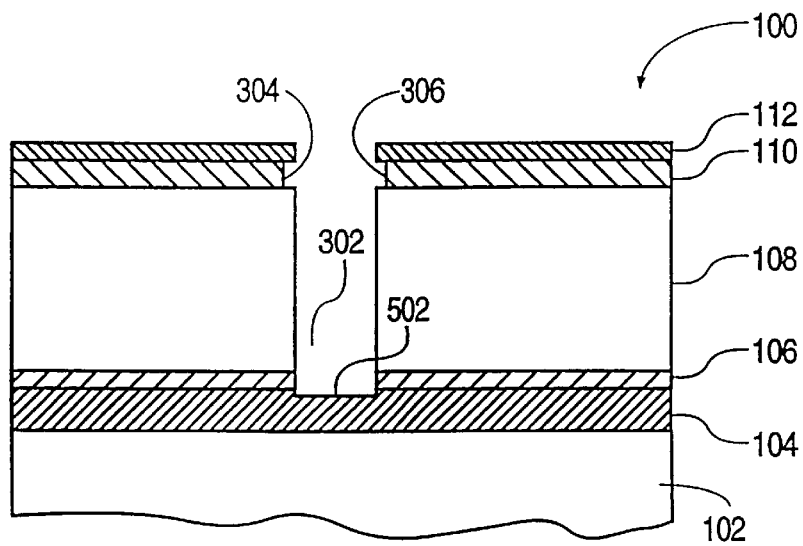

Referring now to FIG. 4, a 500 Å sacrificial oxide 402 is grown along the trench wall to remove defects. The sacrificial oxide and the top residual layer of the LTO layer 114 are then etched off using a hydrofluoric acid (HF) based wet etch resulting in the structure illustrated in FIG. 5. The nitride layer 112 prevents oxidation from occurring beneath it and thus serves as an oxidation mask. Although the nitride layer 112 protects the majority of thermal oxide layer 110 from the LTO layer 114 removal etching process, surfaces 304 and 306 of thermal oxide layer 110 are unprotected by the hard mask and susceptible to etching. Thus unprotected surfaces 304 and 306 are depicted in FIG. 5 as being laterally receded beneath nitride layer 112. Additionally, the 1 $\mu$m oxide layer 104 will be slightly affected at trench 302 bottom 502 following removal of. LTO layer 114 and sacrificial layer 402. However, the recision at bottom 502 may be eliminated by using other wafer platforms which do not contain the 1 $\mu$m oxide layer 104.

Figure 6:
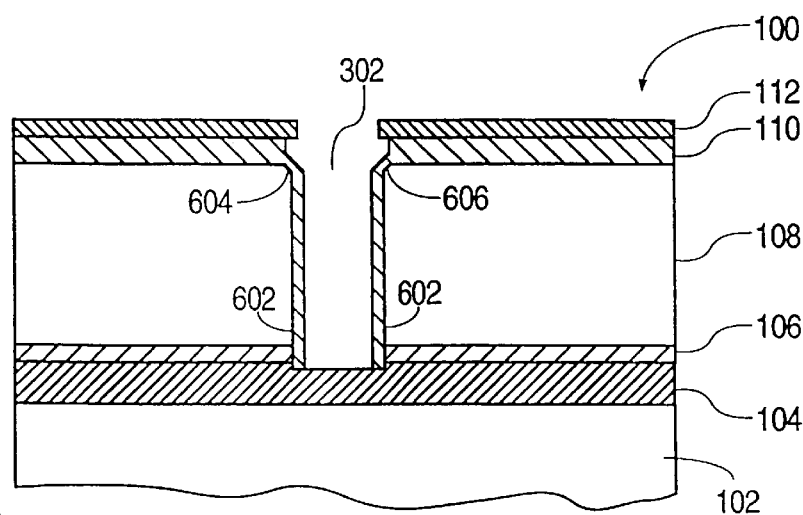

Next, as shown in FIG. 6, following the removal of the LTO layer, a 500 Å thin silicon dioxide ("pad oxide") layer 602 is subsequently grown within trench 302 and lines trench 302. The pad oxide 602 growth process involves the reaction of Si(solid) with oxygen ($O_2$) (vapor) and is accomplished using a Bruce Technologies 7351 furnace manufactured by Bruce Technologies, International, a North Billerica, Mass. company, at 1050° C. and atmospheric pressure for about 20 minutes. Because of the thinness of the pad oxide 602, any bird's beak formed under nitride layer 112 is of a negligible size and is not a concern. Additionally, the thin pad oxide 602 should be thin enough to alleviate concerns of introducing stress at the corners 604 and 606 of trench 302 during temperature cycles of subsequent fabrication steps. Furthermore, thin pad oxide 602 requires relatively minimal growth time which minimizes the opportunity for dopant redistribution in areas occupied by electrical circuit elements (not shown).

The thin pad oxide 602 will proceed to uniformly grow in the areas having an exposed silicon surface. Because some of the device layer 108 silicon is consumed by the pad oxide 602 growth process, the corners 604 and 606 of device layer 108 are rounded. The nitride layer 112 prevents the growth of an oxide layer underneath the nitride layer 112 with the exception of thin pad oxide 602 growth in the area of corners 604 and 606.

Figure 7:
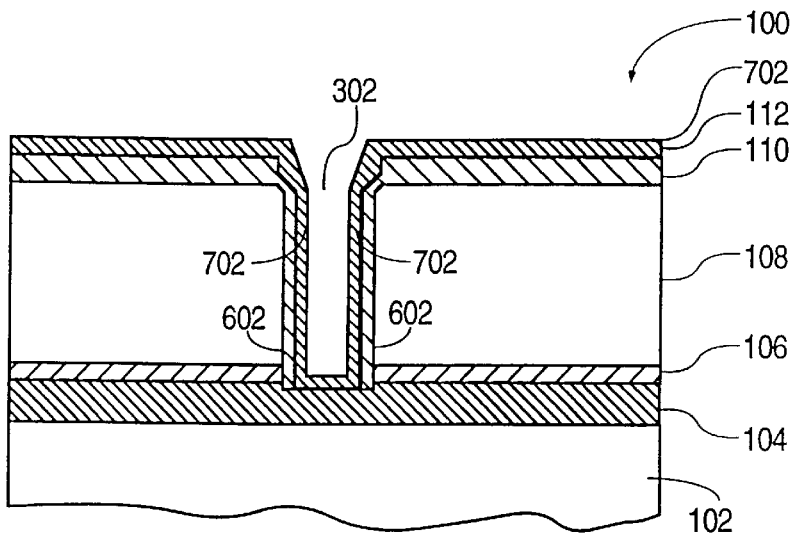

As depicted in FIG. 7, following the growth of the pad oxide 602, a thin 300 Å nitride layer 702 is conformally deposited on existing nitride layer 112 and on the pad oxide 602 within trench 302. The nitride layer 702 deposition involves the reaction of dichlorosilane ($SiCl_2H_2$) and ammonia ($NH_3$) to form silicon nitride, hydrochloric acid (HCl) and hydrogen ($H_2$). The nitride layer 702 deposition process is accomplished using a Pacific Western System Model CDS-1 manufactured by Pacific Western System, a Mountain View, Calif. company, at 800° C. and 340 mTorr for about 3 minutes and 30 seconds. The thin nitride layer 702 lines the trench 302 walls and bottom and serves to prevent further oxidation of device layer 108 and to minimize vertical bird's beak formation in subsequent processing steps.

Figure 8:
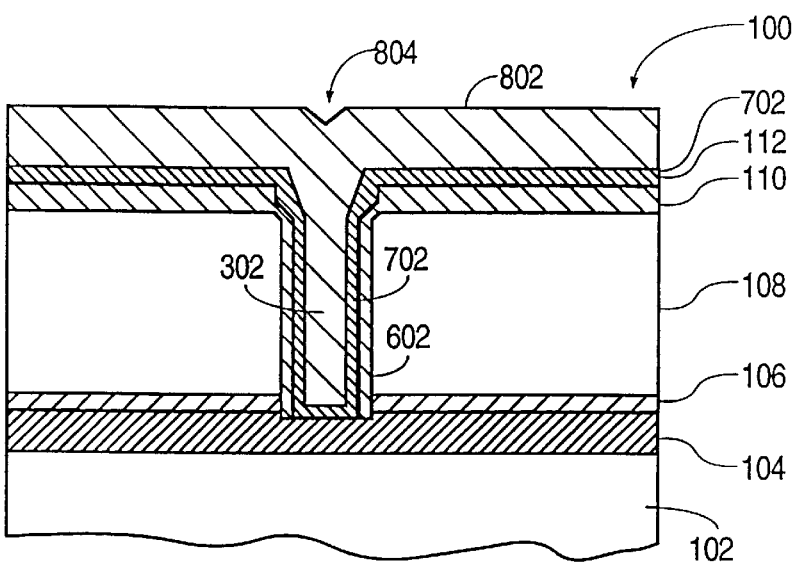

Referring now to FIG. 8, a layer of polysilicon 802 is deposited by means of low pressure chemical vapor deposition so that it completely fills trench 302 and eventually rises 1.5 μm above nitride layer 702 so that the bottom of cusp 804 is above the opening of trench 302. The polysilicon 802 deposition involves the decomposition of silane ($SiH_4$) and is accomplished using a Bruce Technologies 7351 furnace and Advanced Crystal Sciences gas flow tubing apparatus, manufactured by Advanced Crystal Sciences, Inc., a San Jose, Calif. company, respectively, at 625° C. and 250 mTorr for about 3 minutes and 30 seconds. As a result of having the same thermal expansion coefficient, polysilicon trench material 802 and the silicon device layer 108 experience lower stresses during subsequent processing steps than trenches filled with material(s) having a higher thermal expansion coefficient than the device layer. During the polysilicon filling process, the thickness of the deposited polysilicon 802 increases on the trench walls 302 until the polysilicon 802 deposited on the walls of trench 302 meet and initially form a seam. The seam closes as trench 302 is filled resulting in a void-free trench.

Additionally, during the filling of trench 302, a cusp 804, associated with the closure of the seam between the two meeting surfaces of polysilicon, forms above the central region of the trench 302. The filling of trench 302 with polysilicon results in a trench having an absence of voids.

Figure 9:
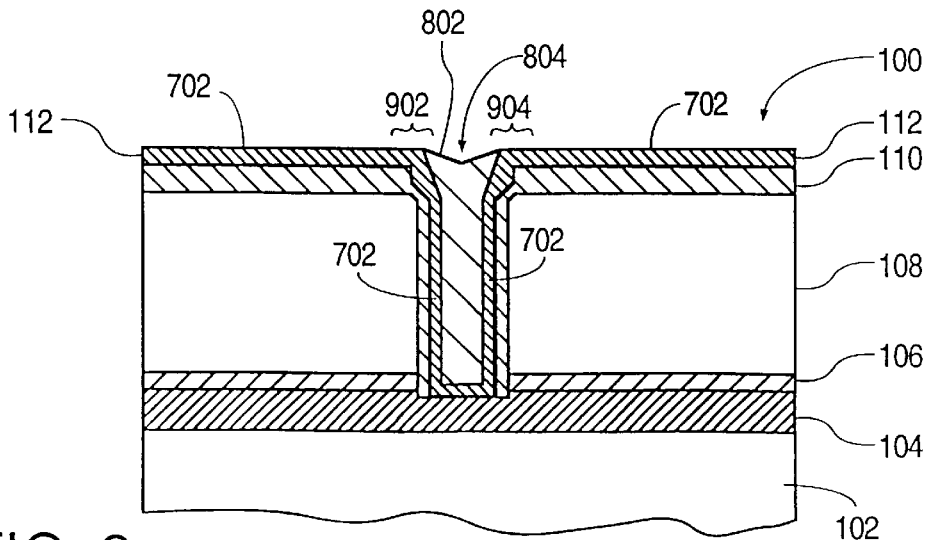

Next, as illustrated in FIG. 9, the polysilicon layer 802 above nitride layer 702 and above trench 302 is etched back. Polysilicon layer 802 is etched using a reactive ion etch process with the etch ending at the polysilicon layer 802-nitride layer 702 interface. The polysilicon layer 802 etch process is accomplished using a LAM490, manufactured by Lam Research Corp., a Fremont, Calif. company, with $O_2$ and HCl at 20° C. and 650 mTorr for about 9–10 minutes. Because the etch rate of polysilicon layer 802 is approximately uniform on all-exposed surfaces, cusp 804 remains. The surface of polysilicon layer 802 is accordingly nonplanar at this point in the fabrication process.

Figure 10:
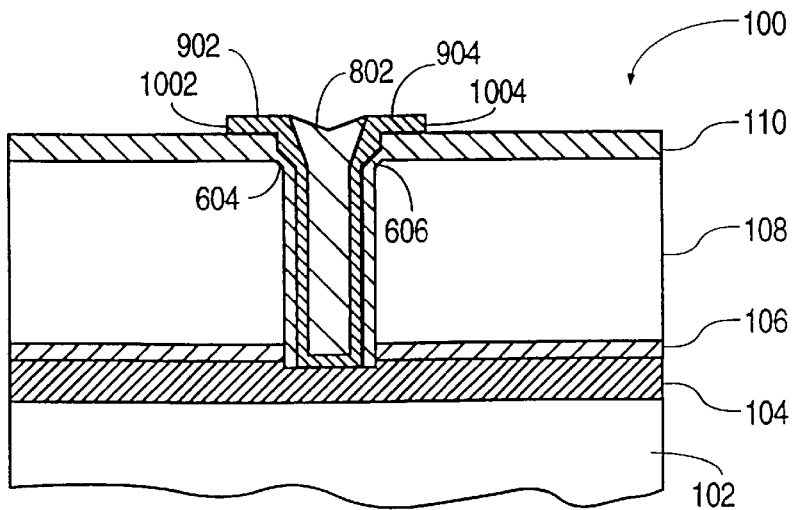

Referring to FIG. 9, a layer of photoresist (not shown) is applied and developed by conventional techniques to protect the surfaces 902 and 904 of nitride layer 702 extending from trench 302 and residing along the perimeter of trench 302 and to protect the polysilicon trench fill material 802. The photoresist mask is a reverse oversized trench mask. Referring now to FIG. 10, the unprotected nitride layer is subsequently removed by etching, leaving only the nitride layers 1002 and 1004 overlapping the sides of trench 302 onto oxide 110 as shown in FIG. 10. The overlapping nitride layers 1002 and 1004 have a lateral dimension of about 1 μm. The unprotected nitride layer etch process is accomplished using a LAM490, manufactured by Lam Research Corp., a Fremont, Calif. company, with $SF_6$ and $O_2$ at 20° C. and 275 mTorr for about 20 seconds. The photoresist mask was intentionally oversized so as to substantially protect the nitride beneath surfaces 902 and 904 thus forming overlapping nitride layers 1002 and 1004 which remain on a region of the semiconductor body contiguous with the opening of trench 302. The overlapping nitride layer 1004 forms a diffusion barrier which prevents oxidation of the corners 604 and 606 at the trench walls and the formation of vertical bird's beak between the nitride layer 702 and the device layer 108 during subsequent integrated circuit process steps facilitating oxidation such as field oxide growth steps.

Figure 11:
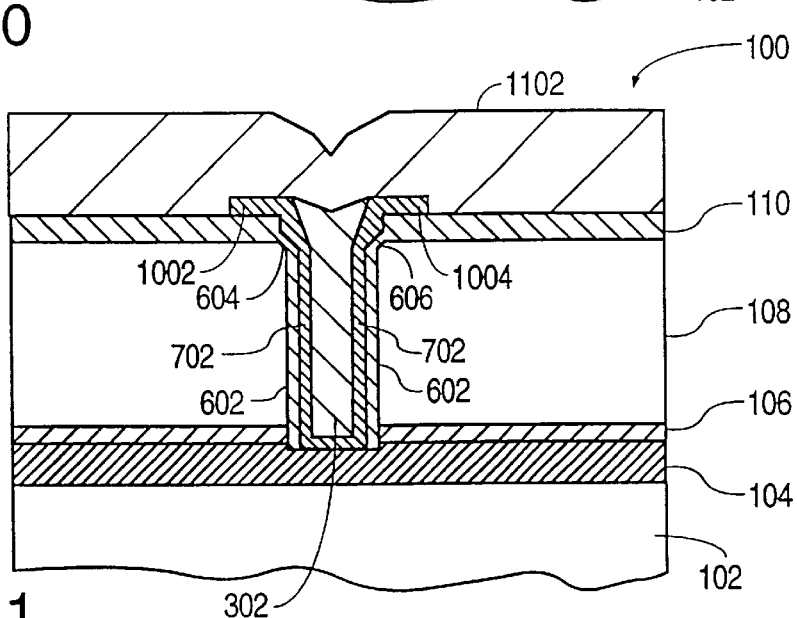

Referring now to FIG. 11, in order to achieve a planar surface, a 6% Phosphorus doped LTO-layer 1102 (phosphosilicate glass or "PSG") is deposited on top-of the wafer 100 to a depth of 7000 Å as shown in FIG. 11; however, the range may vary, for example from 4000 Å to 8000 Å, as necessary to provide sufficient oxide for subsequent processing and to minimize non-planarity. The low temperature deposition of $SiO_2$ involves a reaction of silane and oxygen to form undoped $SiO_2$ films. The addition of phosphine ($PH_3$) to the gas flow forms phosphoric anhydride ($P_2O_5$), which is incorporated into the $SiO_2$ film to produce the Phosphosilicate glass. Other compounds and varying concentrations may be substituted for the 6% Phosphorus doped LTO. For example, the concentration of Phosphorus may increase above 6% to about 9%. Also, it will be appreciated that the use of borophosphosilicate glass will reduce the flow temperatures and duration over that necessary when reflowing undoped LTO at atmospheric pressure. Further, a doping of some of the Silicon in the LTO with Germanium will have similar effects. Note that the presence of overlapping nitride layers 1002 and 1004 prevents oxidation of underlying features and accompanying characteristics such as stress defects at the corners 604 and 606 and vertical birds beak formation between nitride layer 702 and oxide layer 602 within trench 302.

Figure 12:
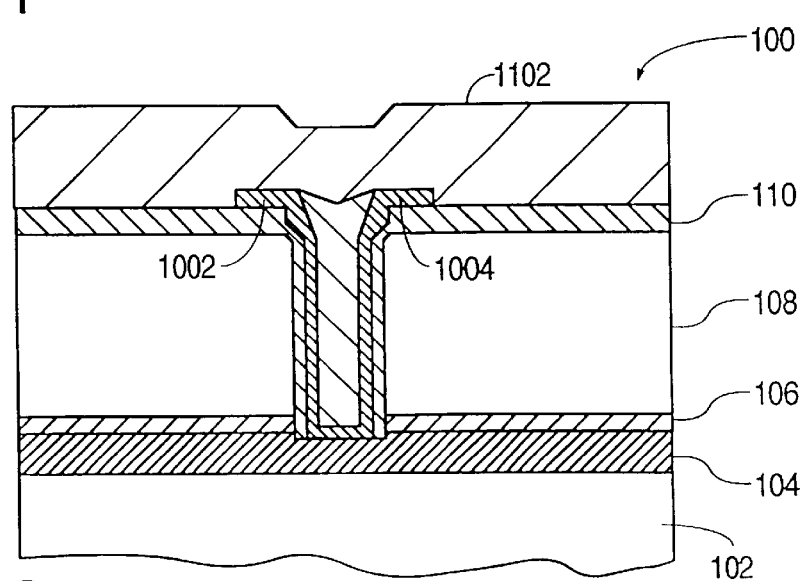

Referring now to FIG. 12, the PSG 1102 exhibits a substantially planar surface following a reflow procedure thereby providing a planarized trench. Using a High Pressure Oxidation ("HIPOX") furnace, the PSG is reflowed in a steam ambient at a temperature of 950° C. +/−2° C. and a pressure of 25 atmospheres for 3–5 minutes. As a result of using the HIPOX furnace, the PSG may be reflowed at relatively low temperatures for a shorter duration than necessary when reflowing oxide at atmospheric pressure. The details of the PSG flow process in a high pressure environment are described in Razouk, U.S. Pat. No. 4,455, 325 which is incorporated herein by reference. As a result, stress defects arising from thermal expansions and undesirable dopant movements are reduced if not eliminated. The reduction of dopant movements allows for reducing the separation between doped regions of circuit devices which increases device density. Furthermore, the relatively short duration of the elevated flow temperature results in energy cost savings due to a low thermal budget over processes utilizing high temperatures for relatively long periods of time. Additionally, due to the presence of the nitride layers 1002 and 1004, the minimization of defect generation at the trench corners due to oxidation during reflow is achieved.

Figure 13:
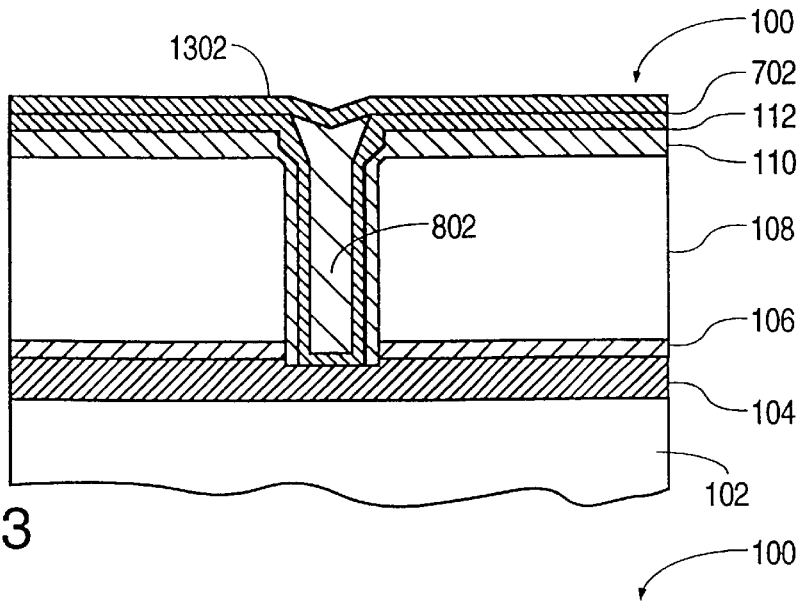
FIGS. 13 through 15 illustrate a cross sectional representation of an alternative structure which may be used in conjunction with the structure and process of FIGS. 1–12.

Referring now to FIG. 13, the above process may be modified by inserting a process step of depositing an additional 300 Å layer of nitride 1302 following the polysilicon layer 802 etching process. The nitride layer 1302 may be deposited using the same process as the deposition of nitride layer 702. The nitride layer 1302 will prevent any oxidation of the polysilicon 802 within the trench 302 during reflow of the LTO layer 1102. The presence of nitride layer 1302 will further minimize the generation of stress defects during the subsequent reflow of LTO layer 1102.

Figure 14:
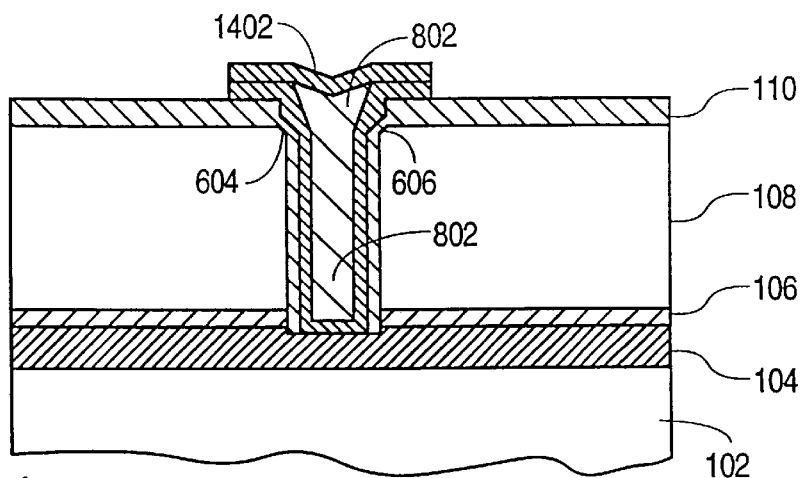
Figure 15:
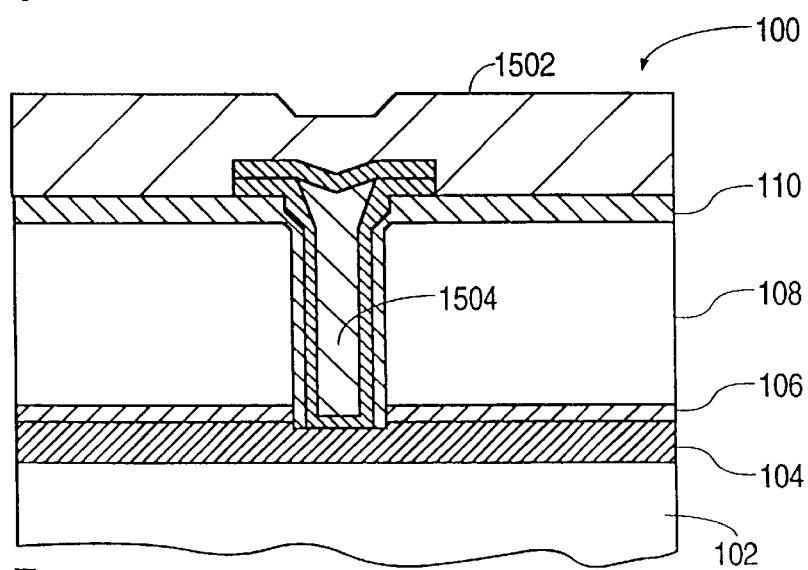

If the additional step illustrated by FIG. 13 is inserted,,the formation of the oversized trench mask shown in FIG. 14 and subsequent etching process will result in the structure illustrated in FIG. 14 rather than the structure in FIG. 10. The structure of FIG. 14 has a nitride cap 1402 which provides double protection of oxidation of the corners 604 and 606 and prevents the oxidation of the polysilicon trench fill material 802. The fabrication process associated with FIGS. 11 and 12 may now continue as previously described and results in the planarized trench shown in FIG. 15.

In another embodiment, both the FIG. 5 trench and the FIG. 6 trench proceed directly to the filling step illustrated in FIG. 8. Next, the polysilicon is etched down to silicon oxide layer 110, and a layer of silicon nitride is deposited. The nitride over the corners of trench 302 is protected by a conventional etch mask while the remaining nitride is removed in an etch step. Alternatively, a continuous layer of silicon nitride forming a cap overlying the trench and the trench corners may be protected by a reverse oversized trench mask while the remaining nitride is removed in an etch step.

Referring now to FIG. 12, the semiconductor with trench 302 planarized doped LTO layer 1102 is now ready for the fabrication of integrated circuit elements (not shown). (Note: the semiconductor with the trench 1504 illustrated in FIG. 15 with doped LTO layer 1502 is also now ready for the fabrication of integrated circuit elements). In order to form the integrated circuit elements, a masking layer is applied over the doped LTO layer 1102. The unprotected portions of the doped LTO layer 1102 and oxide layer 110 are etched to device layer 108. The exposed areas of device layer 108 are used to form the integrated circuit elements using dopant implantation or other conventional technologies. Alternatively, the trench 302 may be formed and doped LTO layer 1102 planarized following the fabrication of integrated circuit elements (not shown). In this event, a masking layer is applied over doped LTO layer 1102 in FIG. 12. The unprotected portions of the doped layer 1102 and oxide layer 110 are etched to device layer .108 forming contact/via holes which may be filled using conventional contact/via filling technologies.

The barrier layer and planarization techniques described above may also be used with other trench wall profiles such as non-vertical walls, tapered walls, and curved walls which may be formed using conventional process technologies. The process described may be used in conjunction with bipolar, MOS, CMOS, as well as other process technologies. Additionally, the described process may be used in conjunction with National Semiconductor's LB250T product line.

Accordingly, various other embodiments and modifications and improvements not described herein may be within the spirit and scope of the invention, as defined by the following claims.

What is claimed is:

1. A method of filling an orifice disposed in a wafer and having an orifice opening onto a surface of the wafer, wherein the wafer surface is external to the orifice, the method comprising the steps of:

forming an oxygen diffusion barrier within the orifice and over the wafer surface contiguous to the orifice opening so that a portion of the oxygen diffusion barrier extends from the orifice opening;

filling the orifice with a filler material;

removing any filler material substantially external to the orifice, wherein the remaining filler material is disposed substantially within the orifice;

following the filler material removing step, concurrently removing the oxygen diffusion barrier except for the oxygen diffusion barrier portion over the wafer surface proximate to the orifice opening to substantially prevent subsequent oxidation of a portion of the wafer adjacent to the orifice opening and under the remaining oxygen diffusion barrier portion over the wafer surface, wherein a lateral dimension of the oxygen diffusion portion over the wafer surface proximate to the orifice opening is about 1 μm; and forming a dielectric layer over the filler material and at least over the portion of the oxygen diffusion barrier over the wafer surface.

2. The method as in claim 1, wherein the oxygen diffusion barrier is formed on a surface of the orifice.

3. The method as in claim 1, further comprising the step of:

flowing the dielectric layer.

4. The method as in claim 3, wherein the flowing of the dielectric layer occurs at a pressure of about 25 atmospheres and a temperature of about 950° C. for 3–5 minutes.

5. The method as in claim 1, wherein the wafer includes a silicon device layer, the oxygen diffusion barrier is silicon nitride, the filler material is polysilicon, and the dielectric layer is a phosphosilicate glass having a 6 to 9 percent concentration of phosphorus.

6. The method as in claim 1 wherein the removing step includes etching the filler material.

7. The method as in claim 1 comprising the further steps of:

depositing a second oxygen diffusion barrier over the filler material and on the oxygen diffusion barrier portion disposed over the wafer surface proximate to the orifice opening before depositing the dielectric layer; and terminating the second oxygen diffusion barrier substantially coterminous with the oxygen diffusion barrier over the wafer surface proximate to the orifice opening.

8. The method as in claim 7, wherein the second oxygen diffusion barrier is silicon nitride.

9. The method as in claim 7 wherein the step of depositing a second oxygen diffusion barrier further includes depositing the second oxygen diffusion barrier on an exposed portion of filler material at the orifice opening, wherein the second oxygen diffusion barrier prevents oxidation of the filler material.

10. The method as in claim 1 wherein the removing the oxygen barrier layer step comprises the steps of:

patterning a reverse oversized orifice mask over the orifice and over part of the wafer surface; and etching exposed portions of the oxygen diffusion barrier.

11. The method as in claim 10 wherein the patterning step comprises the steps of:

applying a photoresist layer over the orifice and over the wafer surface; and developing the photoresist to form a reverse oversized orifice mask.

12. The method of claim 1 wherein the oxygen barrier layer removing step immediately follows the filler material removing step.

13. The method of claim 1 wherein the oxygen barrier layer removing step terminates the oxygen diffusion barrier about 1 μm from the orifice opening.

14. The method of claim 1 further comprising the step of:

forming a stress relief layer on an orifice surface; and oxidizing the wafer surface.

15. The method of claim 1 wherein the filling step includes depositing the filler material.

16. The method of claim 1 wherein the filler material and the device layer have substantially the same thermal expansion coefficients.

17. The method of claim 1 wherein the orifice is a trench.

18. The method as in claim 1 further comprising the step of:
   forming integrated circuit elements in the wafer.

19. A method of forming an integrated circuit having a trench disposed at least partially in a device layer of a wafer and opening onto a surface of the wafer, wherein the wafer surface is external to the trench, the method comprising the steps of:
   forming a stress relief material on the surface of the trench;
   forming an oxygen diffusion barrier over and coextensive with the entire stress relief material and over the wafer surface;
   depositing filler material in the trench;
   removing any filler material external to the trench, wherein the filler material and the device layer generally have the same thermal expansion coefficients;
   following the filler material removing step, concurrently removing the oxygen diffusion barrier disposed over the wafer surface except for a portion of the oxygen diffusion barrier disposed over an immediate periphery portion of the wafer surface contiguous with the trench opening, wherein the portion of the oxygen diffusion barrier disposed over the immediate periphery portion of the wafer surface extends about 1 $\mu$m length from a periphery of the trench and substantially prevents subsequent oxidation of the wafer immediately adjacent to the trench opening;
   forming at least partially integrated circuit elements in portions of the device layer outside of the trench;
   depositing a planarizing layer over the trench and on the portion of the oxygen diffusion barrier layer extending from the trench opening; and
   applying heat to the planarizing layer to flow the planarizing layer, wherein the stress relief layer substantially prevents formation of stress in a portion of the device layer proximate to the trench opening, and the oxygen diffusion barrier substantially prevents subsequent oxidation of the device layer portion proximate to the trench opening.

20. The method as in claim 19 wherein the oxygen diffusion barrier removing step comprises the steps of:
   applying a photoresist layer over the trench and over the wafer surface;
   developing the photoresist to form a reverse oversized orifice mask; and
   etching exposed oxygen diffusion barrier so that the immediate periphery portion on the wafer surface contiguous with the trench opening has a lateral dimension of about 1 $\mu$m.

21. The method of claim 19 wherein the device layer is silicon, the stress relief layer is silicon oxide, the oxygen diffusion barrier is silicon nitride, and the filler material is polysilicon.

22. The method of claim 19 wherein the oxygen diffusion barrier removing step immediately follows the filler material removing step.

23. The method as in claim 19 wherein the step of forming an oxygen diffusion barrier includes the step of depositing silicon nitride; and
   wherein the step of forming a stress relief layer includes the step of growing a silicon pad oxide.

24. A method of filling and planarizing a trench disposed at least partially in a device layer of a wafer and opening onto a surface of the wafer, wherein the wafer surface is external to the trench, the method comprising the steps of:
   oxidizing the surface of the trench and at least a periphery portion of the wafer surface contiguous with the trench opening to form a pad oxide;
   depositing a barrier layer over and coextensive with the pad oxide, wherein the barrier layer includes a first portion to substantially prevent further oxidation of the surface of the trench and a second portion overlapping the wafer surface;
   filling the inside of the trench with a fill material, wherein the fill material includes a first surface disposed along the barrier layer first portion and a second surface substantially at the trench opening;
   applying photoresist over the barrier layer second portion and on the fill material second surface;
   developing the photoresist to form an oversize trench mask over the trench and partially over the barrier layer second portion;
   contemporaneously etching exposed barrier layer wherein the barrier layer second portion terminates proximate to the trench opening to substantially prevent subsequent oxidation of the periphery portion of the wafer adjacent to the trench opening and under the barrier layer second portion;
   forming a planarizing layer over the trench and over the barrier layer second portion; and
   applying heat to flow the planarizing layer to form a planarized layer;
   wherein the lateral dimension of the barrier layer second portion terminates about 1 $\mu$m from the trench opening.

25. The method as in claim 24, wherein the filler material has generally the same thermal coefficient of expansion as the device layer.

26. The method as in claim 24 wherein the step of oxidizing the surface of the trench includes the step of growing the pad oxide.

27. The method as in claim 24 wherein the step of depositing a barrier layer includes the step of depositing silicon nitride.

28. A method of filling and planarizing a trench disposed in a wafer and opening onto a surface thereof, the method comprising the steps of:
   forming a stress relief material on the surface of the trench;
   forming a first oxygen diffusion barrier disposed over the stress relief material and over the surface of the wafer, the oxygen diffusion barrier having a surface overlying the wafer surface;
   depositing filler material;
   etching the filler material, wherein a portion of the filler material is exposed at the trench opening
   forming a second oxygen diffusion barrier disposed on the exposed filler material and on the first oxygen diffusion barrier surface overlying the wafer surface, wherein the second oxygen diffusion barrier prevents subsequent oxidation of the filler material;
   applying a photoresist layer on the second oxygen diffusion barrier;
   developing the photoresist mask such that an oversized trench mask is formed over the trench and over a portion of the oxygen diffusion barrier overlying the wafer surface;
   etching the unprotected first and second oxygen diffusion barriers such that portions of the first and second oxygen diffusion barriers disposed over a periphery portion of the wafer surface contiguous with the trench opening remain and terminate proximate to the trench opening wherein the first and second oxygen diffusion barriers protected during the etching step have a lateral dimension over the periphery portion of the wafer surface of about 1 μm to substantially prevent subsequent oxidation of a portion of the wafer adjacent to the trench opening and under the first and second oxygen diffusion barrier portions disposed over the periphery portion of the wafer surface;

depositing a planarizing layer over the wafer surface and the remaining portion of the first and second oxygen diffusion barriers; and applying heat to the planarizing layer to flow the planarizing layer, wherein the stress relief layer substantially prevents formation of stress in the periphery portion of the wafer contiguous with the trench opening and the oxygen diffusion barrier substantially prevents oxygen diffusion and subsequent oxidation of the periphery portion of the wafer contiguous with the trench opening.

29. The method as in claim 28 wherein the step of forming a stress relief layer includes the step of growing a pad oxide;

wherein the step of forming a first oxygen diffusion barrier includes the step of depositing silicon nitride; and wherein the step of forming a second oxygen diffusion barrier includes the step of depositing silicon nitride.

30. A method of filling and planarizing a trench disposed in a wafer, the trench having an opening intersecting a surface of the wafer, the method comprising the steps of:

oxidizing a wall of the trench and the surface of the wafer proximate to the intersection of the trench opening and the wafer surface;

forming a first oxygen barrier layer on the oxidized wall and on the wafer surface overlapping the intersection;

filling the trench with filler material;

etching the first oxygen barrier layer so that the overlapping first oxygen barrier layer terminates over the wafer surface proximate to the intersection;

depositing dielectric material over the trench and over the first oxygen barrier layer on the wafer surface;

forming a second oxygen barrier layer on the overlapping first oxygen barrier, wherein the second oxygen barrier layer is disposed between the filler material and the dielectric material; and etching the second oxygen barrier layer so that the second oxygen barrier layer is coterminous with the first oxygen barrier layer on the wafer surface, wherein the first and second oxygen barrier layers terminate about 1 μm from the intersection of the trench opening and the wafer surface to substantially prevent subsequent oxidation at the intersection of the trench opening and the wafer surface.

31. The method of claim 30 wherein the first and second oxygen barrier layers are silicon nitride.

32. The method of claim 30 further including the steps of:

applying photoresist over the first oxygen barrier layer and over the trench; and developing the photoresist to form a reverse oversized trench mask.

33. A method of filling an orifice disposed in a wafer and having an orifice opening onto a surface of the wafer, the method comprising the steps of:

forming a first oxygen diffusion barrier within the orifice and over the wafer surface contiguous to the orifice opening so that the first oxygen diffusion barrier extends from the orifice opening and terminates about 1 μm from the orifice opening over the wafer surface;

filling the orifice with a filler material;

forming a second oxygen diffusion barrier on a surface of the first oxygen diffusion barrier portion extending from the orifice opening and on an exposed surface of the filler material, wherein the second oxygen diffusion barrier is coterminous with the first oxygen diffusion barrier and minimizes any oxidation of the exposed surface of the filler material; and depositing a dielectric layer over the second oxygen diffusion barrier.

34. The method as in claim 33 wherein the forming a first oxygen diffusion barrier includes the steps of:

depositing a silicon nitride layer within the orifice; and wherein the step of forming a second oxygen diffusion barrier includes the steps of:

depositing a silicon nitride layer on the surface of the first oxygen diffusion barrier portion extending from the orifice opening and on the exposed surface of the filler material;

the method further comprising the steps of:

applying a layer of photoresist over the wafer surface and over the orifice opening;

developing a reverse oversized orifice photoresist mask; and etching exposed silicon nitride layers.

35. The method as in claim 33 further comprising the step of:

growing a pad oxide within the orifice, wherein the first oxygen diffusion barrier is formed on the pad oxide.

36. The method as in claim 33 wherein the step of depositing the dielectric layer over the second oxygen diffusion barrier comprises the step of:

after the step of forming a second oxygen diffusion barrier, depositing a low temperature oxide layer over the second oxygen diffusion barrier.

37. A method for forming an integrated circuit having an orifice disposed in a wafer and having an orifice opening onto a surface of the wafer, wherein the wafer surface is external to the orifice, the method comprising the steps of:

forming an oxygen diffusion barrier over the surface of the orifice and over the wafer surface proximate to the orifice opening;

filling the orifice with a filler material;

removing any filler material external to the orifice;

forming an oversize orifice photoresist mask over the orifice and on the oxygen diffusion barrier portion formed proximate to the orifice opening;

following the filler material removing step, concurrently removing the oxygen diffusion barrier over the surface of the wafer except for the portion of the oxygen diffusion barrier portion formed proximate to the orifice opening to substantially prevent subsequent oxidation of a portion of the wafer adjacent to the orifice opening and under the oxygen diffusion barrier portion over the wafer surface, wherein a lateral dimension of the oxygen diffusion barrier portion over the wafer surface proximate to the orifice opening is about 1 μm;

forming a planarizing layer over the filler material and over the remaining oxygen diffusion barrier; and forming electrical circuit devices in the wafer.

38. The method as in claim 37 further comprising the steps of:

forming integrated circuit elements in the wafer.

39. The method as in claim 37 wherein the orifice is a trench having substantially vertical walls.

40. The method as in claim 37 wherein the step of forming a planarizing layer over the filler material and over the remaining oxygen diffusion barrier comprises the step of:

forming a planarizing low temperature oxide layer over the filler material and over the remaining oxygen diffusion barrier.

41. The method as in claim 37 wherein the step of concurrently removing the oxygen diffusion barrier further comprises concurrently removing the oxygen diffusion barrier over the surface of the wafer except for a portion of the oxygen diffusion barrier portion formed within approximately 1 $\mu$m to the orifice opening.

* * * * *